United States Patent
Fukuda et al.

(10) Patent No.: US 8,203,888 B2
(45) Date of Patent: Jun. 19, 2012

(54) NON-VOLATILE SEMICONDUCTOR STORAGE DEVICE

(75) Inventors: Koichi Fukuda, Yokohama (JP);
Makoto Iwai, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/875,794

(22) Filed: Sep. 3, 2010

(65) Prior Publication Data

US 2011/0075485 A1    Mar. 31, 2011

(30) Foreign Application Priority Data

Sep. 25, 2009  (JP) ................................. 2009-220141

(51) Int. Cl.
*G11C 11/34* (2006.01)

(52) U.S. Cl. ......... 365/185.21; 365/185.22; 365/185.25; 365/185.01; 365/185.03; 365/185.05; 365/185.18; 365/185.19; 365/185.17; 365/189.15; 365/189.05; 365/203; 365/204; 365/207

(58) Field of Classification Search ............. 365/185.17, 365/185.22, 185.25, 185
See application file for complete search history.

(56) References Cited

U.S. PATENT DOCUMENTS

| 5,570,315 | A  | * | 10/1996 | Tanaka et al. ............ 365/185.22 |
| 7,046,568 | B2 |   | 5/2006  | Cernea |
| 7,486,562 | B2 |   | 2/2009  | Ogawa et al. |
| 7,570,513 | B2 |   | 8/2009  | Li et al. |
| 2006/0034140 | A1 | * | 2/2006 | Ogawa et al. ............ 365/230.03 |
| 2009/0040835 | A1 |   | 2/2009 | Ogawa |

FOREIGN PATENT DOCUMENTS

| JP | 2000-76882 | 3/2000 |
| JP | 2006-500727 | 1/2006 |
| JP | 2006-79803 | 3/2006 |
| JP | 2009-43357 | 2/2009 |
| WO | WO 2009/006513 A1 | 1/2009 |

\* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

A non-volatile semiconductor storage device according to one aspect of the present invention includes a plurality of sense amplifier circuit that are configured to carry out a plurality of read cycles on a plurality of bit lines connected to those memory cells that are selected by a selected one of the word lines. During the second and subsequent read cycles, supply of a read current is ceased to those bit lines when it is determined in the preceding read cycle that a current not less than a certain determination current level flows therethrough, and the read current is supplied only to the remaining bit lines. A setup time of the bit lines in the first read cycle is set shorter than a setup time of the bit lines in the second and subsequent read cycles.

20 Claims, 9 Drawing Sheets

NON-VOLATILE SEMICONDUCTOR STORAGE DEVICE

CROSS REFERENCE TO RELATED APPLICATIONS

This application is based on and claims the benefit of priority from prior Japanese Patent Application No. 2009-220141, filed on Sep. 25, 2009, the entire contents of which are incorporated herein by reference.

BACKGROUND

1. Field

The present invention relates to a non-volatile semiconductor storage device.

2. Description of the Related Art

NAND-cell type flash memory has a sense amplifier circuit that determines data by detecting the absence or presence, or the magnitude of cell currents flowing depending upon data of memory cells. A sense amplifier circuit is usually connected to a bit line to which many memory cells are connected. Sense amplifiers include voltage detection type sense amplifiers and current detection type sense amplifiers.

In the voltage detection type sense amplifiers, for example, a bit line separated from a memory cell is precharged to a certain voltage, and then discharged by a selected memory cell. The discharged state of the bit line is detected by a sense node connected to the bit line. In data sensing, a bit line should be separated from a current source load to detect a bit-line voltage that is determined by data (cell data) retained in a memory cell (see, for example, Japanese Patent Laid-Open No. 2000-076882).

On the other hand, the current detection type sense amplifiers perform data sensing with supplying a read current from a current source load via a bit line to a memory cell. The magnitude of a current flow depends on the cell data, and thus the voltages of the bit line and a sense node connected to the bit line vary with cell data. Data is determined by detecting this voltage difference of the sense node (see, for example, Japanese Patent Laid-Open No. 2006-79803).

The voltage detection type sense amplifiers consume less power since they determine cell data by means of charging and discharging of electric charge of a bit line. However, due to large capacity memory with a large bit-line capacitance, it takes a longer time to charge or discharge the bit line, and thus it becomes more difficult to achieve high-speed sensing. In addition, in a voltage detection type sense amplifier, the bit line voltage may swing relatively larger depending on cell data. Accordingly, coupling noise between adjacent bit lines is problematic. As such, it is necessary to employ a bit line shield scheme in which an odd-numbered bit line is used as a shield line when an even-numbered bit line is sensed. Therefore, it is not possible to sense neighboring bit lines concurrently if the voltage detection type sense amplifiers are used.

In contrast, the current detection type sense amplifiers allow for high-speed sensing since they perform data sensing while supplying a read current via a bit line to a memory cell. In addition, a clamping transistor positioned between a bit line and a sense node may reduce the swing of bit-line voltage depending on cell data, and thus coupling noise between neighboring bit lines is not a significant problem. Therefore, such NAND-cell type flash memory employing a scheme to read a plurality of adjacent bit lines concurrently (All Bit Line sense scheme: ABL sense scheme) utilize the current detection type sense amplifiers.

However, these current detection type sense amplifiers suffer from increased power consumption due to continuous supply of a read current from a current load source. Particularly, problems arise when all bit lines are read concurrently in the ABL scheme: the charging time becomes longer because of increased parasitic capacitance of bit lines due to miniaturization of memory cells, increasing the current consumption as well as sensing times.

Therefore, as described in Japanese Patent Laid-Open No. 2006-79803, after reading all bit lines in the first read operation with the ABL scheme, supply of a read current from a current source load is ceased in the second read operation for those bit lines from which "1" data has already been read in the first read operation. This scheme may suppress current consumption.

However, the above-mentioned scheme also has a problem in that the read current has a large peak value and the peak current period increases since all bit lines are to be read in the first read operation. Notably, since the spacing between adjacent bit lines becomes smaller and smaller as miniaturization of memory cells advances, the parasitic capacitance of bit lines increases correspondingly and it takes longer for the bit lines to be charged to a certain voltage.

DETAILED DESCRIPTION

One aspect of the present invention provides a non-volatile semiconductor storage device comprising: a memory cell array including an array of NAND cell units, each of the NAND cell units including a memory string having a plurality of memory cells connected in series and selection transistors each connected to an end of the memory string; a plurality of word lines each commonly connected to those of the memory cells aligned along a first direction; a plurality of bit lines each connected to one end of each of the NAND cell units; a source line connected to the other end of each of the NAND cell units; and a plurality of sense amplifier circuits, each of the sense amplifier circuits being configured to determine data retained in the memory cell by supplying a certain read current to the bit line and detecting a magnitude of a current flowing through the bit line after a setup time required for the current to reach a steady state. The sense amplifier circuits are configured to carryout a plurality of read cycles on a plurality of the bit lines each connected to any one of the memory cells that are selected by a selected one of the word lines. During the second and subsequent read cycles, the sense amplifier circuits stop supplying the read current to any one of the bit lines when it is determined in the preceding read cycle that a current not less than a certain determination current level flows therethrough, while keep supplying the read current to the remaining bit lines. A setup time of the bit lines in the first read cycle is set shorter than a setup time of the bit lines in the second and subsequent read cycles.

The non-volatile semiconductor storage device according to embodiments of the present invention will now be described in detail below with reference to the accompanying drawings.

[First Embodiment]

Figure 1:
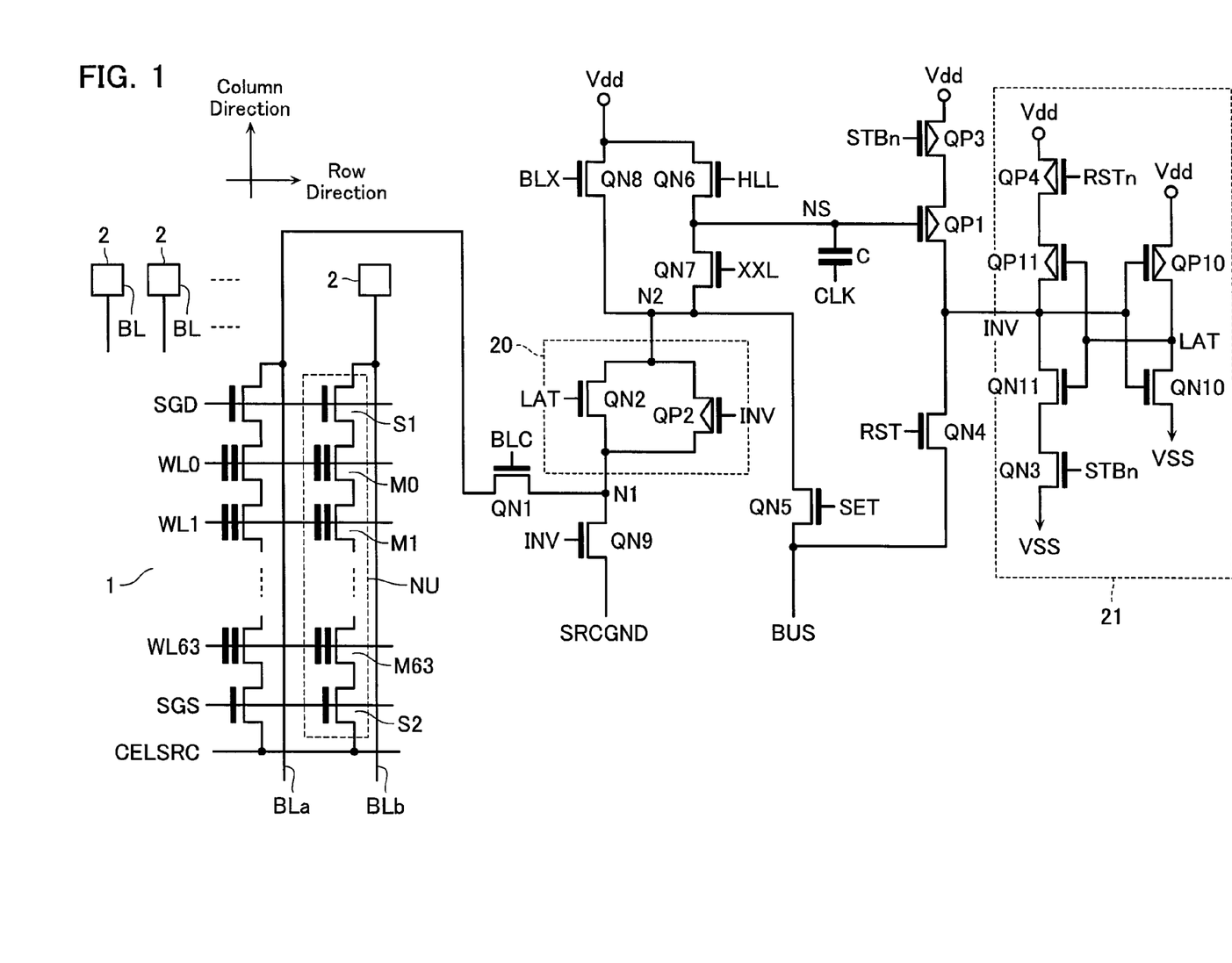
FIG. 1 illustrates a configuration of a memory cell array 1 and a sense amplifier circuit 2 connected thereto in a NAND type flash memory according to a first embodiment.

FIG. 1 illustrates a configuration of a memory cell array 1 and a sense amplifier circuit 2 connected thereto in a NAND type flash memory according to a first embodiment. The memory cell array 1 includes electrically rewritable non-volatile memory cells M positioned at respective intersections between a plurality of word lines WL extending in the row direction and a plurality of bit lines BL extending in the column direction. A plurality of memory cells M are connected in series to provide a NAND cell unit NU. A sense amplifier circuit 2 is provided corresponding to each of the plurality of bit lines BL. Then, the plurality of bit lines BL are to be read concurrently.

While a plurality of NAND cell units NU are arranged in the memory cell array 1, FIG. 1 only illustrates two representative NAND cell units connected to two bit lines BLa and BLb.

Each NAND cell unit NU has a plurality of (64 in this illustrative example) memory cells M0-M63 connected in series (a memory string). The memory string has one end connected via a select gate transistor S1 to a bit line BL, and the other end connected via a select gate transistor S2 to a common source line CELSRC.

The control gates of the memory cells M0-M63 are connected to different word lines WL0-WL63. As illustrated in FIG. 1, a plurality of (e.g., 65536) memory cells Mi (i=0 to 63) that are aligned in the row direction are connected to a common word line WLi.

The gates of select gate transistors S1 and S2 are connected to select gate lines SGD and SGS parallel to a word line WL, respectively.

The select gate line SGD is commonly connected to a plurality of (e.g., 65536) select gate transistors S1 that are aligned in the row direction. Similarly, the select gate line SGS is also commonly connected to a plurality of select gate transistors S2 that are aligned in the row direction.

Each bit line BL is connected to a sense amplifier circuit 2. Each sense amplifier circuit 2 has a function for, at the time of data read, determining data of a selected memory cell by supplying a read current to the NAND cell unit and detecting the magnitude of current flowing through the bit line BL.

FIG. 1 only illustrates one representative sense amplifier circuit 2 connected to a bit line BLa. Similar sense amplifier circuits 2 are also connected to a bit line BLb and other bit lines BL (not illustrated).

The sense amplifier circuit 2 comprises an NMOS transistor QN1 for clamping bit-line voltage (hereinafter referred to as a clamping transistor QN1) that is connected to the bit line BL. The voltage of a gate signal BLC of the clamping transistor QN1 is controlled to regulate the voltage of the bit line BL. For example, if it is desired to set the voltage of the bit line BL to 0.3V, the voltage of a gate signal BLC may be set to on the order of 1.3V. In addition, a transfer circuit 20, including an NMOS transistor QN2 and a PMOS transistor QP2, and an NMOS transistor QN7 are provided between the clamping transistor QN1 and a sense node NS.

The bit line BL, which is connected through the clamping transistor QN1, the transfer circuit 20, and the NMOS transistor QN7 to the sense node NS, is to be sensed by the sense amplifier circuit 2. A capacitor C for retaining electric charges is connected between the sense node NS and a sensing clock node CLK.

The transfer circuit 20 connects the clamping transistor QN1 and the sense node NS via the NMOS transistor QN7, and switches the connection between the sense node NS and the clamping transistor QN1 depending on the modes of operation. The transfer circuit 20 and the clamping transistor QN1 are connected to each other at a node N1, and the transfer circuit 20 and the NMOS transistor QN7 are connected to each other at a node N2. Furthermore, the transfer circuit 20 switches between a conductive state and a non-conductive state according to the data retained in a data node LAT and in a data node INV complementary to the data node LAT in a data latch 21, which will be discussed below.

The data latch 21 includes NMOS transistors QN3, QN10, QN11, and PMOS transistors QP4, QP10, QP11.

The transistors QP4, QP11, QN11, and QN3 are connected in series between a power supply voltage node (Vdd) and a ground terminal (VSS). The connection node between the transistors QP11 and QN11 is the data node INV.

In addition, the gate of the transistor QP4 is provided with a control signal (inverted signal) RSTn. The respective gates of the transistors QP11 and QN11 are connected to the data node LAT as mentioned above. Furthermore, the gate of the transistor QN3 is provided with a strobe signal STBn.

In addition, the transistors QP10 and QN10 are connected in series between the power supply voltage node (Vdd) and the ground terminal (VSS). The connection node between the transistor QP10 and the transistor QN10 is the data node LAT. The respective gates of the transistors QP10 and QN10 are connected to the data node INV as mentioned above.

A PMOS transistor QP1 functions as a sensing transistor (hereinafter referred to as a sensing PMOS transistor QP1) for determining the potential of the sense node NS. The gate of the sensing PMOS transistor QP1 is connected to the sense node NS. In addition, the source of the PMOS transistor QP1 is connected via a switching PMOS transistor QP3 to a power supply voltage Vdd. The gate of the switching PMOS transistor QP3 is provided with a strobe signal STBn. The switching PMOS transistor QP3 switches to a conductive state by setting the strobe signal STBn to "L" at the time of data sense.

In addition, the drain of the sensing PMOS transistor QP1 is connected to the data node INV, and is also connected via a switching NMOS transistor QN4 to a node BUS. The gate of the switching NMOS transistor QN4 is provided with a control signal RST. Meanwhile, an NMOS transistor QN5 is connected between the node BUS and the NMOS transistor QN7 (node N2). The gate of the NMOS transistor QN5 is supplied with a control signal SET. This control signal SET is a signal that temporarily turns to "H" before a read operation begins in order to bring the NMOS transistor QN5 into a conductive state and to reset the node N2 to a ground potential Vss by connecting the node BUS to the ground potential and the node N2.

In addition, an NMOS transistor QN9 is connected between the transfer circuit 20 (node N1) and a node SRCGND. During a read operation, the node SRCGND is supplied with the ground potential Vss. Furthermore, the gate of the NMOS transistor QN9 is provided with a potential of the data node INV. That is, the NMOS transistor QN9 turns on when the read data is "1", i.e., when the node INV in the data latch 21 is "H", and then resets the potential of the bit line BL to the ground potential Vss.

In addition, an NMOS transistor QN8 is connected between the node N2 and the power supply voltage node (Vdd). Furthermore, an NMOS transistor QN6 is connected between the power supply voltage node and the sense node NS. The NMOS transistors QN6 and QN7 are current source load transistors that supply a read current to the bit line BL. The gates of the NMOS transistors QN6, QN7, QN8 are provided with control signals HLL, XXL, BLX, respectively.

A brief description will be given on the operation of the sense amplifier circuit 2. Firstly, in a read operation, the node BUS is set to "L" to temporarily set the control signal RST to "H" and the inverted signal RSTn to "L". Then, the NMOS transistor QN4 turns on (conductive state) and the PMOS transistor QP4 turns on (conductive state), whereby the data latch 21 is reset. That is, the data node LAT becomes "H" and the data node INV becomes "L". In addition, the transfer circuit 20 turns on (conductive state). Accordingly, at the time of data read, a read current is supplied from the NMOS transistors QN6, QN7, and QN8 via the transfer circuit 20 through the clamping transistor QN1 to the bit line BL. Furthermore, at this point, the strobe signal STBn is held at "H", while the switching transistor QP3 is maintained in a non-conductive state.

Thereafter, a sensing operation is started to determine the magnitude of currents flowing through the bit line BL after a setup time required for the read current to reach steady state. The control signal HLL supplied to the gate of the NMOS transistor QN6 is first switched from "H" to "L", whereby the NMOS transistor QN6 is brought into a non-conductive state. Then, the sense node NS is discharged by the read current flowing into the bit line BL, and the potential of the sense node NS decreases from the initial power supply voltage Vdd.

In this sensing operation, after a certain period of time, the strobe signal STBn is temporarily set to "L" to make the PMOS transistor QP3 conductive, and a determination is made by the sensing PMOS transistor QP1. If the read current is large, then the potential of the sense node NS would decrease, whereby the sensing transistor QP1 turns on and the data node INV becomes "H".

Conversely, if the read current is smaller than a determination level, then the potential of the sense node NS would not decrease enough to turn on the sensing transistor QP1, and the data node INV remains "L" in its initial state.

When the sense node NS is discharged and decreases in potential, current supply from the sense node NS is ceased. The NMOS transistor QN8 instead turns on, and the read current is then supplied from the NMOS transistor QN8 via the transfer circuit 20 to the bit line BL. Therefore, any noise due to capacitance coupling to the neighboring bit line does not affect detection accuracy since the potential of the bit line BL is maintained within a certain range.

As described below, the sense amplifier circuit 2 of this embodiment carries out at least two read cycles on a selected memory cell for the purpose of reducing the power consumption.

If it is determined in the first read cycle in which all bit lines BL are to be read that a certain bit line BL has "1" data (having current flow exceeding a certain determination level), then the data node LAT of the data latch 21 becomes "L" and the data node INV becomes "H" in the sense amplifier circuit 2 connected to that bit line BL. Accordingly, the transfer circuit 20 turns off. This prevents dissipative current from flowing through the bit line in the second read cycle, thereby reducing the power consumption.

Figure 2:
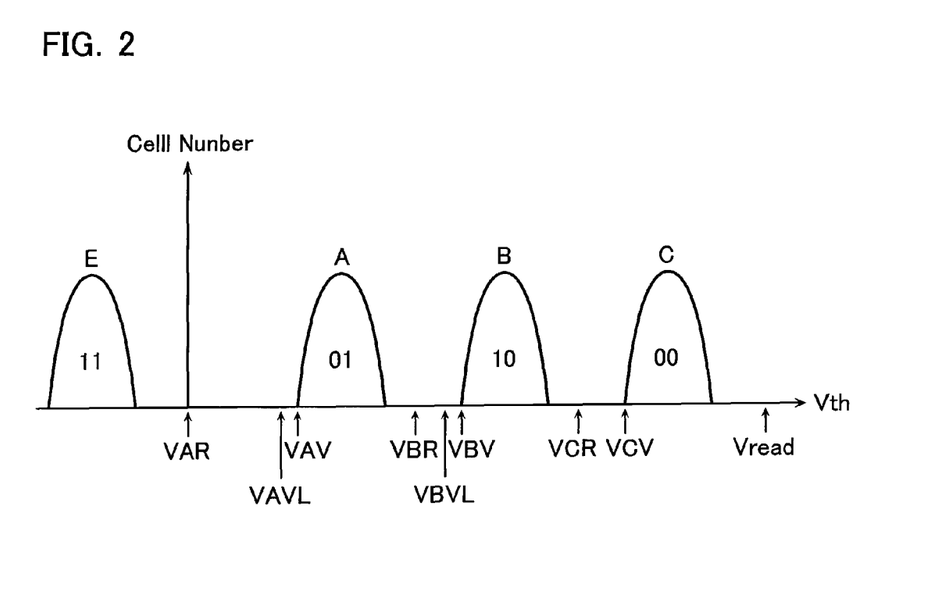
FIG. 2 illustrates threshold voltage distributions of a memory cell in the case of storing 2-bit (4-level) data per memory cell.

Assuming that 2-bit (4-level) data is stored in each memory cell, threshold voltage distributions of a memory cell are as illustrated in FIG. 2. Data in a memory cell having a negative threshold voltage is defined as "11" data (erased state).

In addition, data in a memory cell having a positive threshold voltage is defined as "01" data, "10" data, and "00" data in order of lower to higher threshold voltage. Note that the notation of "@*" data indicates that "@" represents data of an upper page and "*" represents data of a lower page. Threshold voltage distributions E, A, B, C, corresponding to "11", "01", "10", "00" data, are set at certain intervals as illustrated in FIG. 2.

For the purpose of determining to which threshold voltage distribution (E, A, B, C) a memory cell corresponds, read voltages VAR, VBR, VCR as illustrated in FIG. 2 are applied to the control gate of the selected memory cell. These read voltages VAR, VBR, VCR are such voltages that are set to have values between upper limits and lower limits of the four threshold voltage distributions E, A, B, C, respectively.

In addition, verify voltages VAV, VBV, VCV as illustrated in FIG. 2 are such voltages that are applied when a verify read operation is performed to determine whether a write operation of a memory cell is completed after execution of the write operation. These verify voltages correspond to the lower limits of the threshold voltage distributions E, A, B, C.

In addition, when a write scheme of so-called quick pass write scheme is employed, low verify voltages VAVL and VBVL slightly lower than the verify voltages VAV and VBV are also utilized in the verify read operation (hereinafter, while a verify read operation with these low verify voltages VAVL and VBVL will be described for illustrative purposes, the present invention is of course not so limited). It is possible to reduce the width of the threshold voltage distributions A and B by performing quick pass write operations to the threshold distributions A and B by means of verify determination with such low verify voltages VAVL, VAV, VBVL, VBV.

Meanwhile, at the time of data read, the control gates of unselected memory cells in the selected block are applied with a read pass voltage Vread (on the order of 6V-7V) such that it causes the memory cells MC to turn on regardless of to which threshold voltage distribution the memory cells MC correspond.

It should be noted that how many bits of data are stored in one memory cell is not essential to this embodiment, and that this embodiment is applicable whether 1 bit/cell or N bits/cell (N≧2) storage schemes are employed. In the following, as an example, reference will be made principally to the case of employing a 2 bits/cell storage scheme.

Briefly described, the NAND type flash memory performs data erase and write operations as follows. A data erase operation is performed on a block-by-block basis. One block is generally defined as a set of NAND cell units sharing word lines. By applying 0-1 V to all word lines in a selected block and an erase voltage Vera (e.g., 20V) to the p-type well in which a memory cell array is formed, all of the memory cells are brought into a state of "1" data having a low threshold value as electrons are emitted from the floating gates into the channels.

In the case of an N bits/cell storage scheme, a set of memory cells sharing one word line represent N pages, and a data write operation is performed on a page-by-page basis. In writing operation, Vcc−Vt (for "1" data) or Vss (for "0" data) is applied via a bit line to a NAND cell channel depending on data. In this state, upon application of a write voltage Vpgm (e.g., 20V or more) to a word line of a selected page and a write pass voltage Vpass (which causes memory cells to turn on irrespective of data: on the order of 8V) to the unselected word lines in the same block, electrons are injected by the FN tunneling from the channels into the floating gates in those memory cells to which "0" data is written. In those memory cells to which "1" data is written, the channel potential is boosted and increased due to the pass voltage Vpass, and hence such injection of electrons does not occur (write inhibit).

Figure 3:
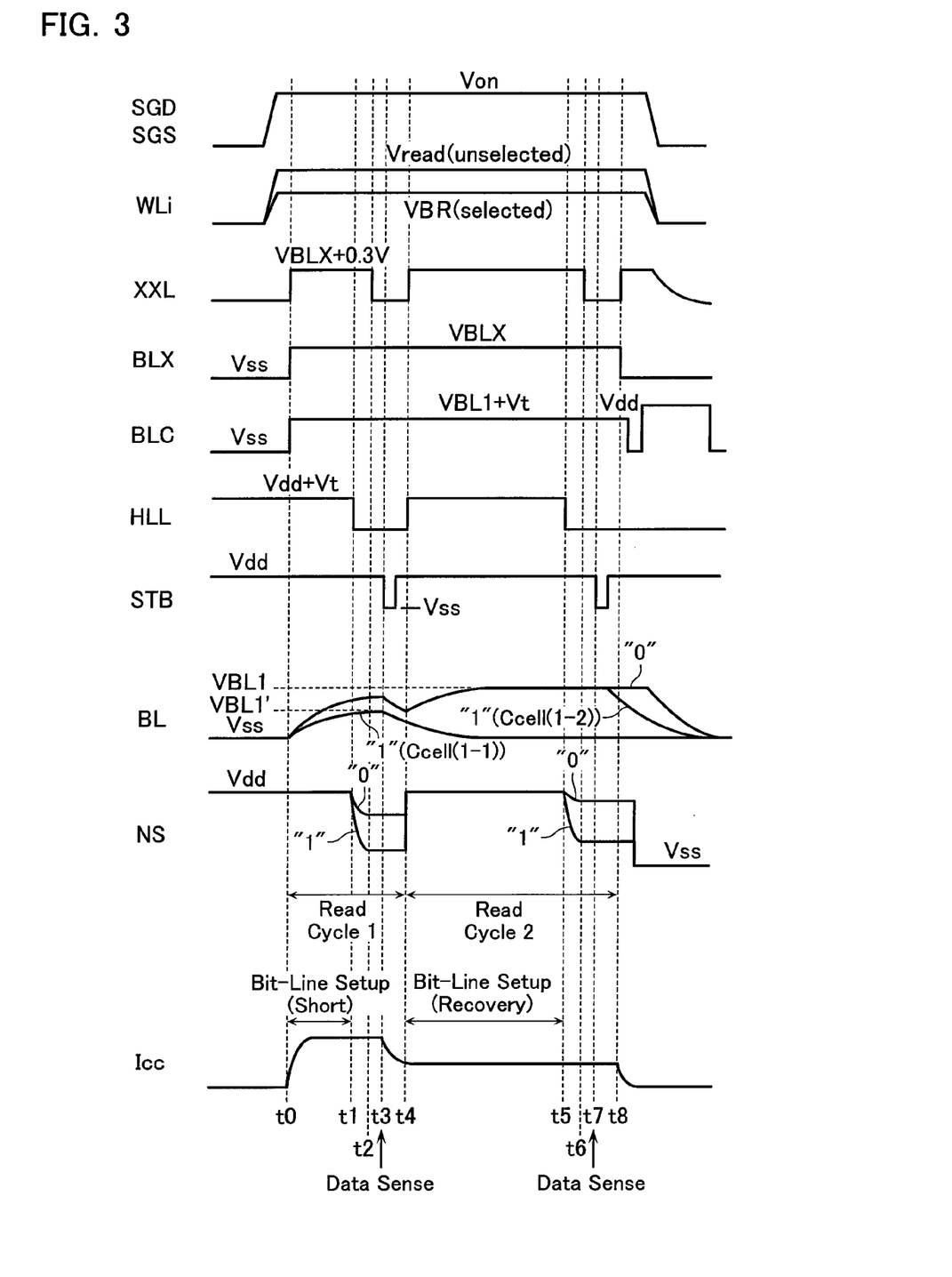
FIG. 3 is a timing chart illustrating a read operation of a LOWER page data by the NAND type flash memory of the first embodiment.
Figure 4:
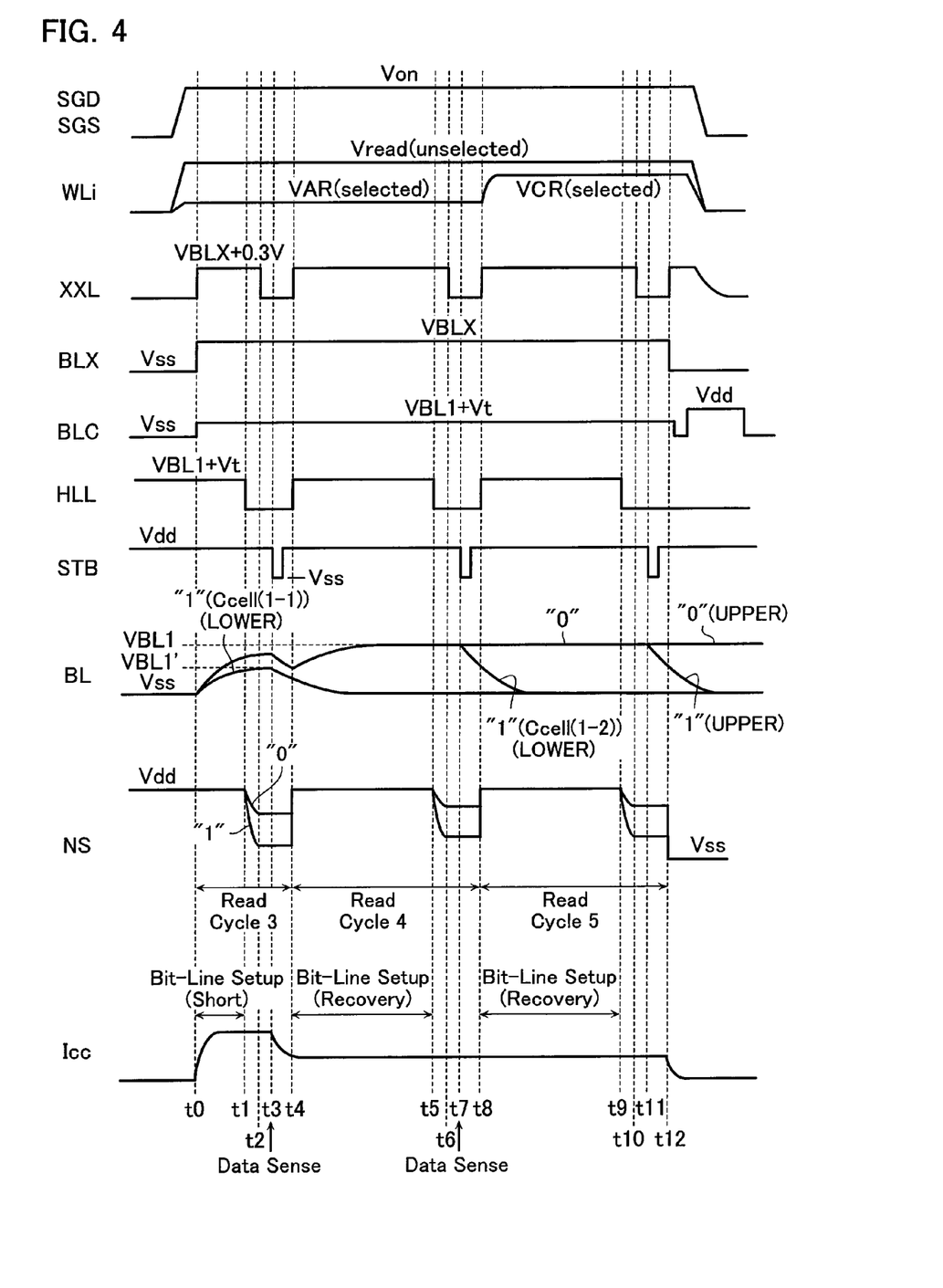
FIG. 4 is a timing chart illustrating a read operation of an UPPER page data by the NAND type flash memory of the first embodiment.

Referring now to the timing charts of FIGS. 3 and 4, a data read operation according to this embodiment will be described below. Each timing chart illustrates a reading scheme when a 2 bits/cell storage scheme is employed: FIG. 3 depicts a read operation of a lower page LOWER; and FIG. 4 depicts a read operation of an upper page UPPER. Note that the voltage ranges of the bit line BL and the sense node NS are exaggerated relative to other nodes in FIGS. 3 and 4.

According to this embodiment, as illustrated in FIGS. 3 and 4, two read cycles 1 and 2 are carried out during each read operation: one to read a lower page LOWER by applying a read voltage VBR and one to read an upper page UPPER by applying VAR. For a bit line BL from which data "1" is read during the first (initial) read cycle 1, the transfer circuit 20 is turned off and no read current is supplied to the bit line BL during the second read cycle 2. Additionally, a voltage of 0V is fixedly supplied from the node SRCGND via the NMOS transistor QN9 to the bit line BL, and hence a read operation is not performed on the bit line BL. The reason why two read cycles are carried out for data determination of 1-bit data is as follows: concurrent read of many bit lines could lead to increase in the potential of the common source line CELSRC which would otherwise be ideally at 0V (leading to lifted potential), which makes accurate determination of reading difficult.

Referring further to the drawings, specific procedures of read operation will be described in detail below. Referring first to FIG. 3, the description will be made on a read operation of a lower page LOWER performed by applying the read voltage VBR. Prior to the read operation, the data latch 21 is reset to the "0" data state (LAT="H", INV="L"). During the read operation, a read voltage VBR is applied to a selected word line WL in a selected block of the memory cell array 1, read pass voltage Vread is applied to unselected word lines WL, and Vsgd and Vsgs are provided to the select gate lines SGD and SGS. A voltage Vdd+Vt, which is sufficient to transfer the power supply voltage Vdd, is applied to the gate HLL of the NMOS transistor QN6.

At time t0, a voltage VBLX, which is lower than the power supply voltage Vdd, is provided to the gate BLX of the NMOS transistor QN8. At the same time, a voltage, which is higher than the voltage VBLX by on the order of 0.3V, is provided to the gate XXL of the NMOS transistor QN7. During this operation of reading a lower page LOWER, a constant gate voltage VBLX is supplied to the gate BLX of the NMOS transistor QN8.

Additionally, at time t0, the voltage of a control signal BLC input to the gate of the clamping transistor QN1 is set to VBL1+Vt, whereby the voltage of a bit line BL is clamped to VBL1. The transfer circuit 20 is in a conductive state since the data latch 21 is initialized (reset) to the state of LAT="H" and INV="L". Accordingly, the current supplied from the NMOS transistors QN6 and QN7 is supplied via the transfer circuit 20 and the clamping transistor QN1 to the bit line BL as a read current. At this point, the NMOS transistor QN8 is in a non-conductive state since the voltage VBLX applied to the gate BLX of the NMOS transistor QN8 is set lower than the voltage applied to the gate XXL of the NMOS transistor QN7 by on the order of 0.3V.

Through this voltage application, charging (precharging) of the bit line BL begins. After a setup time has elapsed that is required for the read current flowing through the bit line BL to reach steady state, at time t1, the control signal HLL supplied to the gate of the NMOS transistor QN6 is switched from the voltage Vdd+Vt (wherein Vt represents a threshold voltage of the NMOS transistor QN6) to the ground potential Vss. Consequently, discharging from the sense node NS begins. Subsequently, at time t2, the control signal XXL of the gate of the NMOS transistor QN7 is switched to the ground potential Vss to stop discharging from the sense node NS.

Thereafter, at time t3, the strobe signal STBn of the switching PMOS transistor QP3 becomes "L" for a certain period of time. This makes the sensing PMOS transistor QP1 activated, after which a sensing operation of the sense node NS in the first read cycle 1 is started.

This setup period (t0 to t1) of the bit line BL in the first read cycle 1 is shorter than, for example, one half (½) or less of the setup period (t4 to t5) of the bit line in the second read cycle 2. The reason for this will be explained later. Note that during the initial phase of the setup period, the sense node NS is charged to Vdd through the NMOS transistor QN6. At time t1, before initiation of the sensing operation, the NMOS transistor QN6 is brought into a non-conductive state according to the signal HLL="L" (Vss). From then on, including the period of sensing operation (t3 to t4), the sense node NS is not charged. During the sensing period (t1 to t2), the current discharged from the sense node NS flows through the NMOS transistor QN7, the transfer circuit 20, and the clamping NMOS transistor QN1 into the bit line BL. Once the sense node NS is discharged and its potential decreases, and when the node N2 is raised to VBLX+0.3V−Vt, then the NMOS transistor QN7 switches to a non-conductive state.

If the cell data is "0", then the sense node NS is maintained at "H" level because no current is drawn into the selected bit line, and thus the NMOS transistor QN8 remains off. If the cell data is "1", then the voltage of the node N2 decreases over time. Once the node N2 is lowered to VBLX+0.3V−Vt or below, a decrease in voltage of the bit line BL is suppressed by the NMOS transistor QN8 switching to a conductive state and supplying current, while the NMOS transistor QN7 switches to non-conductive state.

At time t3, a sensing signal STB is set to "L" (=Vss) for a short time to turn on the PMOS transistor QP3 and data sensing is performed. When the sensing PMOS transistor QP1 has a threshold voltage of Vtp, the sensing PMOS transistor QP1 turns off if the sense node NS has a potential higher than Vdd−|Vtp| (data "0"), while it turns on if the sense node NS has a potential lower than Vdd−|Vtp| (data "1"). Thus, upon detection of "1" data, the node LAT of the data latch 21 is latched to "L" and the node INV is latched to "H".

From this point on, in the sense amplifier from which "1" data is read, the NMOS transistor QN9 turns on and the bit line BL remains in a state where it is reset to the voltage of the node SRCGND, i.e., ground potential Vss. In addition, since LAT="L" and INV="H", the transfer circuit 20 turns off and the sense node NS is also separated from the bit line BL. That is, upon reading "1" during the first read cycle 1, the sense amplifier circuit 2 controls a read current not to flow into that cell and the bit line BL during the next cycle.

With respect to the voltage of the bit line BL, the timing chart of FIG. 3 illustrates changes in voltage in two scenarios at the time of determining "1" data: where "1" is determined during the first read cycle 1; and where "1" is not determined, or "0" is incorrectly detected during the first read cycle 1, and "1" is first determined during the second read cycle. Those "1" data cells whose channel conductance Ccell (1-1) is large enough are determined as "1" data during the first read cycle. On the other hand, those cells whose channel conductance Ccell (1-2) is not large enough may be incorrectly sensed as "0" during the first read cycle even if they actually have "1" data. Such cells are correctly read during the second read cycle 2.

That is, at time t4, HLL="H" (Vdd+Vt) is set again to turn on the NMOS transistor QN6, and XXL="H" (VBLX+0.3V) is set to turn on the NMOS transistor QN7, thereby starting the second read cycle 2. In this cycle, those bit lines BL that are connected to the memory cells determined as "1" during the first read cycle 1 are separated from the sense amplifier circuit 2 (the transfer circuit 20 is turned off), and are discharged to Vss (=0V). Such bit lines BL are not subject to reading during this cycle. Thus, only those bit lines that are connected to the memory cells retaining "0", or actually retaining "1" but incorrectly detected as "0", are subject to precharging (setup (recovery)) during the second read cycle.

As such, during the second read cycle 2, a read current is also supplied to the bit line as in the first read cycle 1, and, at time t5, supply of a current via the NMOS transistor QN7 is ceased to cause discharge from the sense node NS (t5 to t6). Then, at time t7, the sensing signal STBn is set to "L" and data sensing is performed. During the first read cycle, those "1" data cells whose channel conductance Ccell (1-1) is determined to be large enough are excluded from an object of a reading operation. This reduces lifting of the common source line CELSRC. Accordingly, during this second read cycle 2, such "1" data whose conductance is not large enough is also correctly detected as "1", without being incorrectly detected.

As can be seen from the above, according to this embodiment, a data read operation is performed in two read cycles 1 and 2, and, during the second read cycle 2, no read current is supplied to those cells from which "1" is read during the initial read cycle 1. This may still suppress the entire current consumption when a current detection type sense amplifier scheme is used.

Meanwhile, after time t8, the word line WLi, the select gate lines SGD and SGS, the gates of the transistors QN7 and QN8 (signals XXL and BXL), and the bit line BL are discharged to the ground potential to complete the operation. At this point, in order to ensure discharge of the bit line BL, the level of the gate signal BLC is once raised to the power supply voltage Vdd so as to make sure that the NMOS transistor QN1 becomes conductive.

As described above, according to this embodiment, the bit-line setup period (time t0 to t1) in the first read cycle 1 is set shorter than, for example, ½ or less of the bit-line setup period (time t4 to t5) in the second read cycle 2. Thus, during the first read cycle 1, the bit line BL will not be charged to an upper limit VBL1 specified by the clamping transistor QN3. As an example, if a charging time is 20 μS during the second read cycle 2, then a charging time is not more than 10 μS during the first read cycle 1. The reason for this is as follows.

As the parasitic capacitance of bit lines increases with miniaturization of memory, longer bit-line setup times are required for bit lines BL to be charged to an upper limit VBL1 and to reach steady state. On the other hand, while the cell current flowing through individual bit lines BL becomes smaller and smaller as miniaturization of memory cells advances, the total current Icc flowing through all bit lines increases because of the increase in the number of bit lines BL to be read concurrently for improved performance. During the first read cycle 1 in which all bit lines are subject to reading, if a data sensing operation is performed after the current flowing through the bit lines reaches sufficiently steady state with supplying this large current Icc, then the large current Icc would flow for an unacceptably long period of time. In addition, due to this large current flow, there might be situations where it would be difficult to guarantee proper operation for some reason, such as instability in power supply voltage.

Therefore, in this embodiment, a setup time (time t0 to t1) of a bit line BL in the first read cycle is set as described above.

In contrast, as disclosed in Japanese Patent Laid-Open No. 2006-79803 referenced above, a charging time of a bit line BL is set substantially the same for both the first read cycle 1 and the second read cycle 2. In both read cycles, a data sensing operation is started after the current flowing through the bit lines reaches sufficiently steady state. The configuration of Japanese Patent Laid-Open No. 2006-79803 fails to accommodate the increase in power consumption due to the large current Icc during the first read cycle. According to this embodiment, it is possible to reduce the period to one half or less for which this large current flows, suppressing the power consumption as well as operational failures due to drop in power supply voltage.

In this embodiment, since the charging time of a bit line BL is short during the first read cycle 1, the voltage of the bit line BL during the first read cycle 1 will reach up to on the order of a voltage VBL1' which is smaller than the upper limit VBL1, not reaching the upper limit VBL1 specified by the clamping transistor QN3.

The inventors herein have recognized that there is no operational problem during the first read cycle 1 if the current flowing through a bit line BL does not reach sufficiently steady state, or if the charge level of the bit line does not reach a normal upper limit VBL1 for the following reasons. That is, sufficiently large current flows through the bit line BL that is connected to a selected memory cell having "1" data ("1" (Ccell (1-1)) in FIG. 3) whose channel conductance is large enough, without having to wait until the current flowing through the bit line BL becomes substantially equal to the cell current flowing through the memory cells with the bit line BL fully charged to the upper limit VBL1 (i.e., if the bit line BL is only charged to a value VBL1' below the upper limit VBL1). On the other hand, rather than sufficiently large current, current only for charging the capacitance of bit line flows through a bit line that is connected to a selected memory cell ("1" Ccell (1-2) in FIG. 3) having "1" data whose channel conductance is small, or to a selected memory cell having "0" data. This difference in magnitude of currents may be detected by the sense amplifier 2. Detection of this current difference by the sense amplifier circuit 2 allows for identification of a selected memory cell having "1" data whose channel conductance is large enough.

The memory cell ("1" (Ccell (1-1))) thus determined as "1" data in the first read cycle 1 may be excluded from the target of read operation in the second read cycle 2 (the transfer circuit 20 is turned off). As such, the memory cell ("1" (Ccell (1-2)) in FIG. 3) that is not determined as "1" due to its smaller channel conductance as well as those memory cells retaining "0" data are only subject to be read during the second read cycle. Accordingly, the sum of currents flowing through the bit lines becomes smaller than that in the first read cycle, and thus lifting in the source line also becomes small. This allows for precise detection. That is, during the second read cycle 2, it is possible to distinguish between "1" data and "0" data without being affected by any memory cells having a large channel conductance and allowing a large current flow. The object of the first read cycle 1 to exclude those memory cells having a large channel conductance and allowing a large current flow can still be achieved with this short charging time of the bit line BL. In addition, reducing the setup time of the bit line BL to one half or less may result in reduction in time for which large current Icc flows, suppressing the power consumption. Furthermore, there is no concern about instable operation due to drop in power supply voltage.

Similarly, in the read operation of an upper page UPPER as illustrated in FIG. 4, the first read cycle 3 and the second read cycle 4 are also performed when the read operation is performed by applying the voltage VAR to a selected word line WL.

Additionally, as in the case of FIG. 3, a setup time (t0 to t1) of a bit line BL in the first read cycle 3 is set to one half or less of a setup time (t4 to t5) of the bit line BL in the second read cycle 4. As a result, similar advantages may be expected in the read operation of an upper page UPPER.

Note that in the case of FIG. 4, if a read operation is performed by applying the voltage VCR to the selected word line WL, then only one, rather than two, read cycle 5 is carried out (where time t9, t10, t11, t12 correspond to time t1, t2, t3, t4, respectively). Those memory cells having upper pages UPPER determined as "1" data are excluded from the target of read operation with the voltage VAR and the transfer circuit 20 is turned off. Therefore, at the time of reading with the voltage VCR, there is no concern about occurrence of any large current Icc or degradation in reading precision due to lifting in a common source line. Of course, two read cycles may also be carried out in this read operation with applying voltage VCR.

Figure 5:
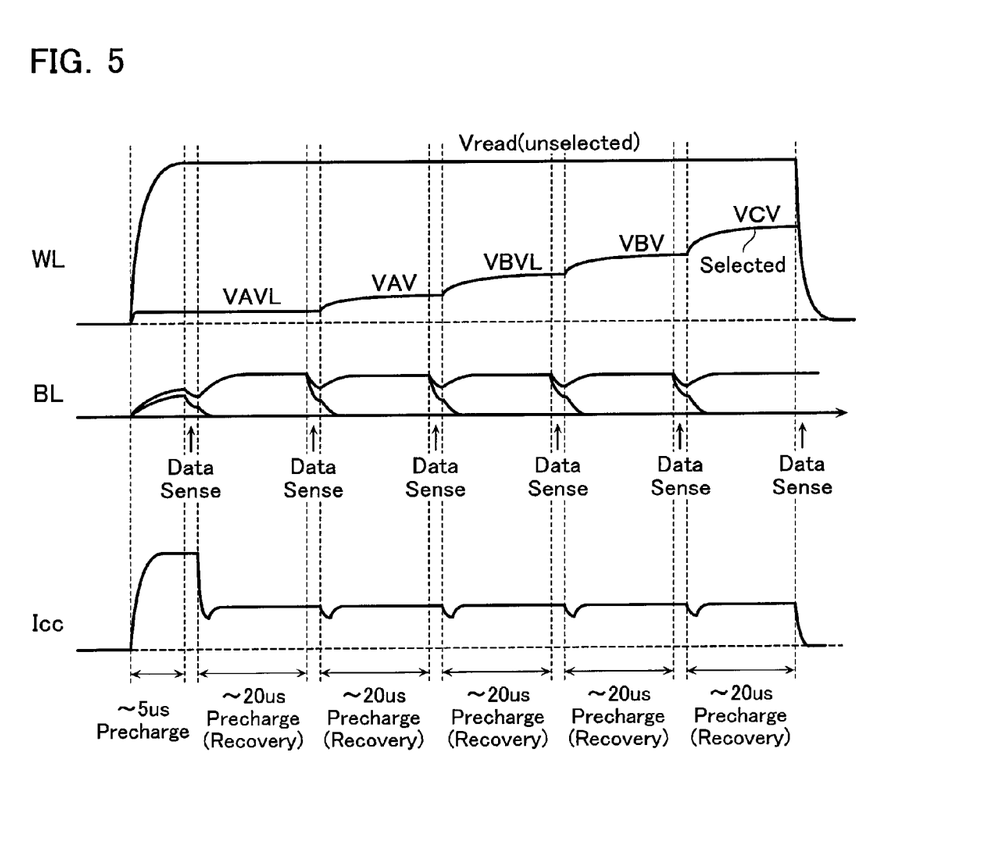
FIG. 5 is a timing chart illustrating an UPPER page verify read operation by the NAND type flash memory of the first embodiment.

FIG. 5 is a timing chart illustrating a verify read operation that is performed to determine whether or not a write operation of desired data is completed after application of a write pulse, in the case of writing 2 bits/cell data as illustrated in FIG. 2 according to the first embodiment.

In the verify read operation presented in this example, the above-mentioned verify voltages VAV, VBV, VCV and low verify voltages VAVL, VBVL are applied to a selected word line WL in order of lower to higher voltage value (in order of: VAVL, VAV, VBVL, VBV, and VCV). Then, data sensing is performed with respective voltages to carry out a verify operation (a read pass voltage Vread is applied to unselected word lines WL as with a normal read operation).

Moreover, the data sensing at the low verify voltage VAVL, which is the lowest voltage value, is performed in two read cycles as in the case of FIGS. 3 and 4. Furthermore, in the first read cycle, the charging time of the bit line BL is reduced to one half or less. As a result, the above-mentioned advantages may also be expected in the verify read operation.

Note that in the above-described embodiments, for example, the data sensing period in the first read cycle 1 of FIG. 3, i.e., the discharging period (t1 to t2) of the sense node NS may be shorter than that in the second read cycle 2. The shorter the data sensing time, the larger the determination threshold (threshold current) at the sense amplifier circuit 2. However, the entire sensing time may be reduced.

[Second Embodiment]

A second embodiment of the present invention will now be described below with reference to FIG. 6 to FIG. 8. The basic configuration of the non-volatile semiconductor storage device of the second embodiment is similar to that illustrated in FIG. 1. This embodiment is also the same as the first embodiment in that two read cycles are carried out for a certain read operation.

Figure 6:
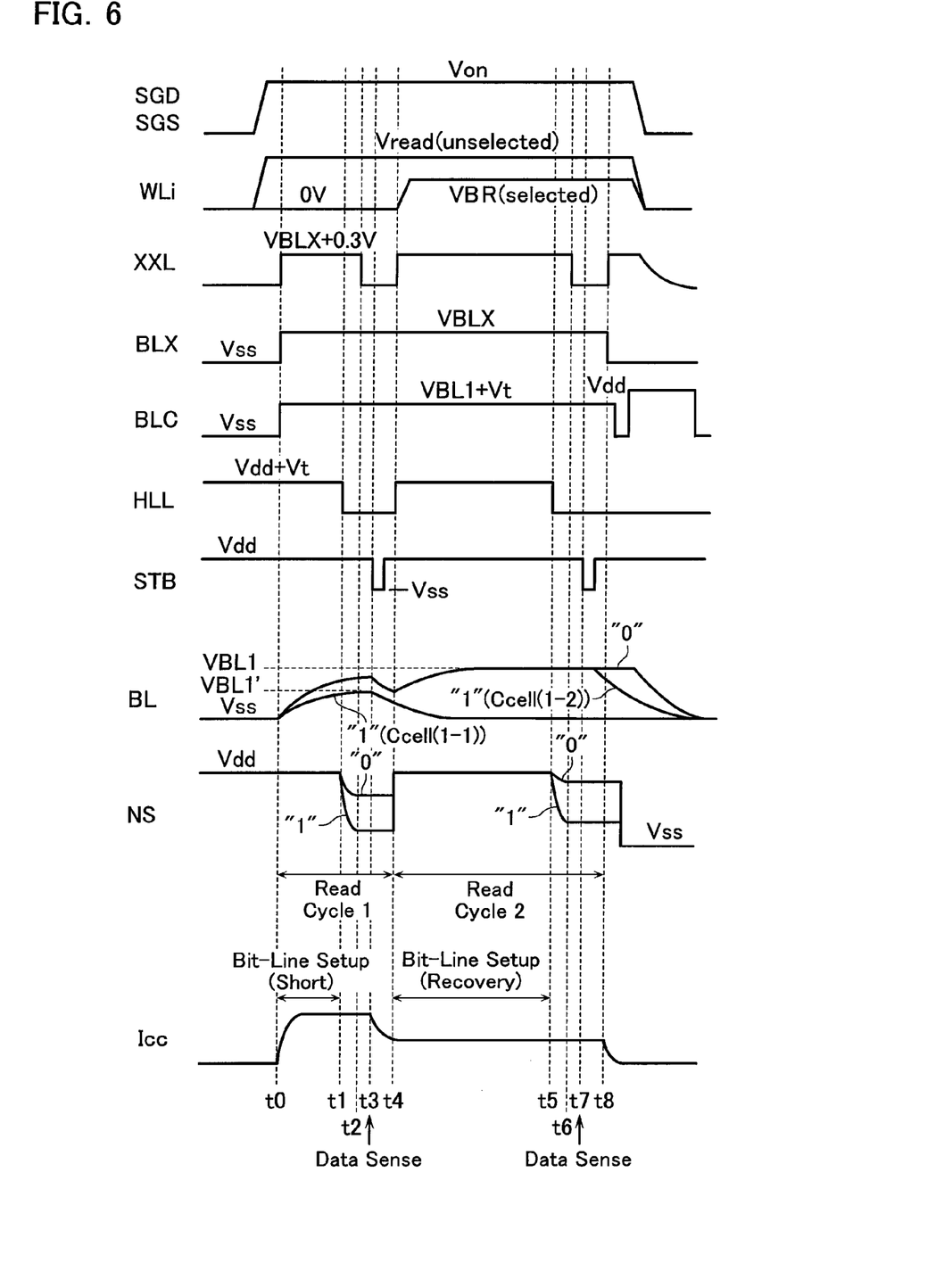
FIG. 6 is a timing chart illustrating a read operation of a LOWER page data by the NAND type flash memory according to a second embodiment.
Figure 7:
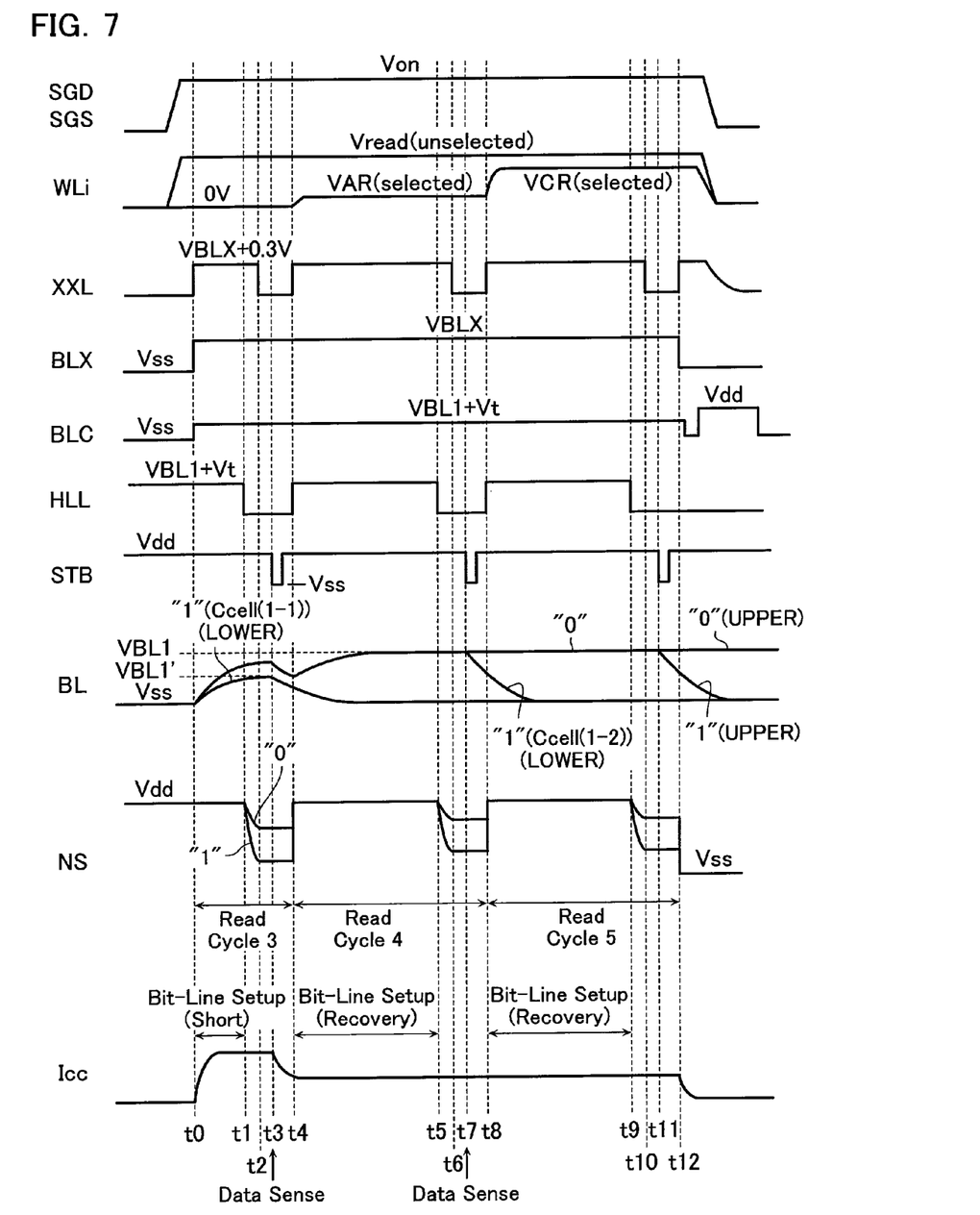
FIG. 7 is a timing chart illustrating a read operation of an UPPER page data by the NAND type flash memory of the second embodiment.

According to this embodiment, FIGS. 6 and 7 illustrate timing charts when read operations of a lower page LOWER and an upper page UPPER are performed in an memory cell array using a 2 bits/cell storage scheme. This operation is similar to the first embodiment, except the voltage applied to a selected word line WL. In the first embodiment, the same voltage VBR is applied to a selected word line WL during both the first read cycle 1 and the second read cycle 2 in a read operation of a lower page LOWER. On the other hand, in this embodiment, as illustrated in FIG. 6, a voltage lower than the voltage VBR, e.g., 0V, is applied to a selected word line WL during the first read cycle 1. In addition, as illustrated in FIG. 7, a voltage lower than the voltage VAR, e.g., 0V, is also applied to a selected word line WL during the first read cycle 1 in a read operation of an upper page UPPER.

Consequently, if the voltage of 0V is applied to the selected word line WL, the selected memory cell still has a sufficiently large channel conductance when it is in an erased state (the distribution E in FIG. 2), and it may be determined as "1" data. Upon application of the voltage VBV to a memory cell in an erased state, as in the first embodiment, the current consumption Icc becomes larger since the cell current becomes larger than applying 0V to the memory cell. In this regard, if the operation is performed as described in the second embodiment, the power consumption may be suppressed more than the first embodiment.

Figure 8:
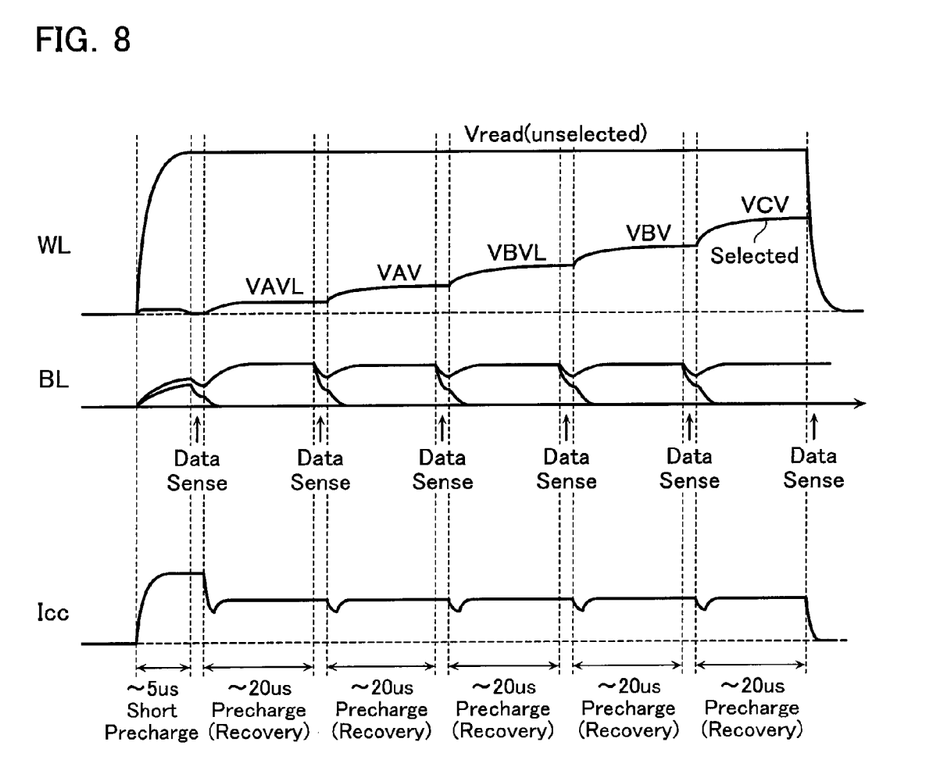
FIG. 8 is a timing chart illustrating an UPPER page verify read operation by the NAND type flash memory of the second embodiment.

In addition, as illustrated in FIG. 8, a read operation may also be performed in a verify read operation by applying a voltage lower than the low verify voltage VAVL, e.g., 0V, during the first read cycle in the read operation with the low verify voltage VAVL. This may suppress the power consumption.

[Third Embodiment]

A third embodiment of the present invention will now be described below with reference to FIG. 9. The basic configuration of the non-volatile semiconductor storage device of the third embodiment is similar to that illustrated in FIG. 1. This embodiment is also the same as the above-mentioned embodiments in that two read cycles are carried out for a certain read operation including a verify read operation. In addition, it is also the same as the above-mentioned embodiments in that a verify read operation is performed with a charging period of a bit line in the first read cycle set shorter than a charging period of the bit line in the second read cycle.

Figure 9:
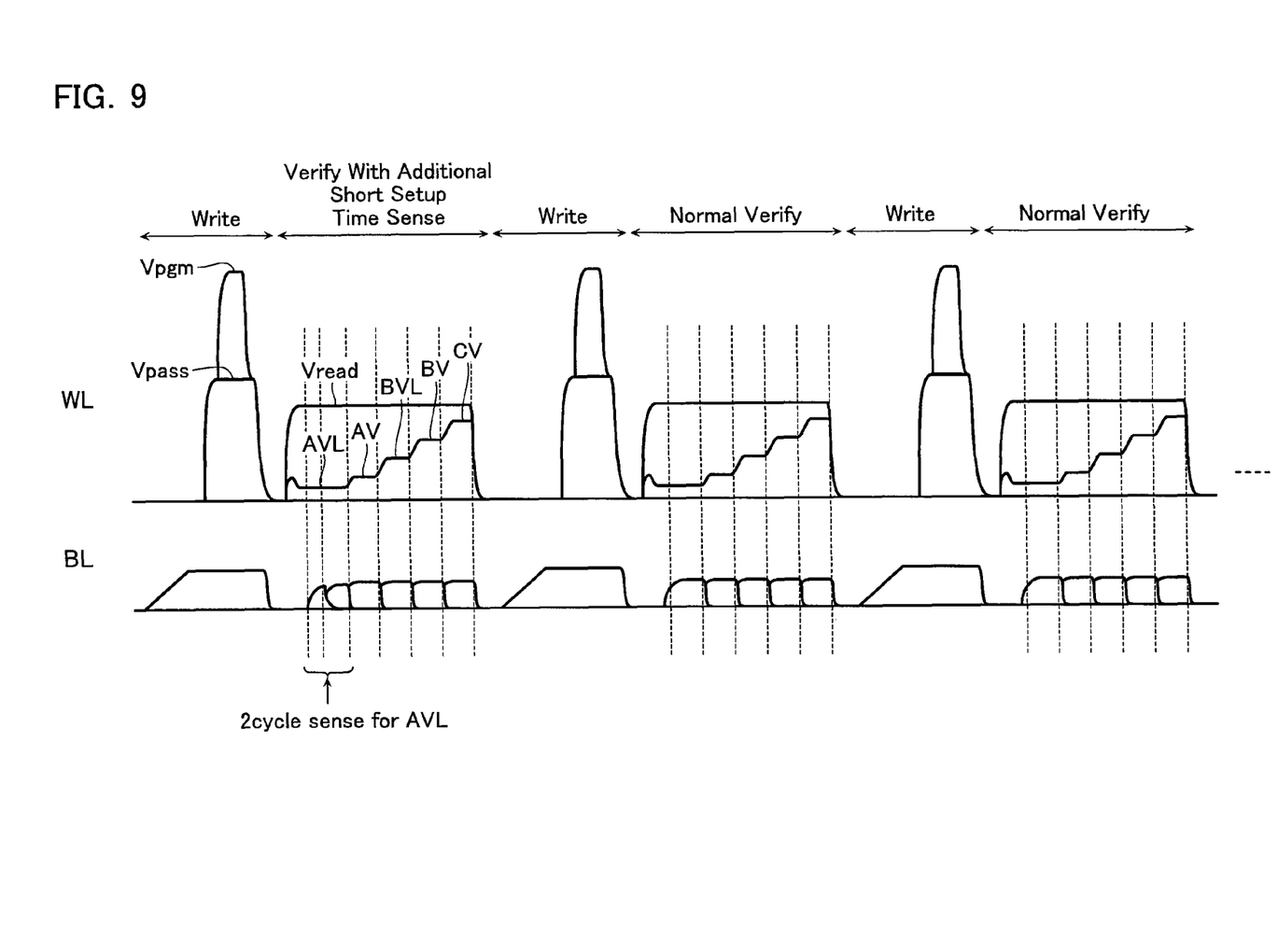
FIG. 9 is a timing chart illustrating an UPPER page verify read operation by the NAND type flash memory according to a third embodiment.

However, according to this embodiment, as illustrated in FIG. 9, during a verify read operation subsequent to the first (or several) write operations, such a sensing operation including two cycles (Verify with Additional Short Setup Time Sense) is performed for an initial voltage level (in this case, voltage VAVL) that involves different bit-line setup periods in length for the first read cycle and the second read cycle. After the first (or several) write operations, a normal verify read operation (Normal Verify) is performed on each voltage level, where a sensing operation is performed in one cycle. This is a difference from the above-mentioned embodiments. Once a certain number of memory cells is written to the threshold voltage distribution A or above during the first one or several write operations, the number of cells in "1" state that have a large channel conductance and allow large current flow will be reduced at the time of initial sensing of the verify read operation. Accordingly, the current Icc flowing through the bit lines BL will also be reduced, and hence the verify read operation of this embodiment is not necessarily performed.

Therefore, a normal verify read operation may be performed, as is conventionally done, subsequent to the first one or several write operations.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

For example, while the above embodiments have been mainly described in the context of execution of two read cycles 1 and 2 as an example, the present invention is not so limited. All such forms may fall within the scope of the invention that exclude those memory cells from the target of read operation that are determined to have "1" data in the preceding read cycle, and that cut off the charging paths to those bit lines connected to the excluded memory cells in the next read cycle.

In addition, while the above embodiments have been primarily described with reference to the operation performed in the case of employing a 2 bits/cell storage scheme, the same advantages may also be obtained by performing an operation exactly the same as that illustrated in FIGS. 3 and 6 when a 1 bit/cell storage scheme is adopted.

Furthermore, it will be readily understood that the same operation is applicable by merely increasing the types of read voltage even if 3-bit or more data should be stored in one memory cell.

What is claimed is:

1. A non-volatile semiconductor storage device comprising:
    a memory cell array including an array of NAND cell units, each of the NAND cell units including a memory string having a plurality of memory cells connected in series and selection transistors each connected to an end of the memory string;
    a plurality of word lines each commonly connected to those of the memory cells aligned along a first direction;
    a plurality of bit lines each connected to one end of each of the NAND cell units; a source line connected to the other end of each of the NAND cell units; and
    a plurality of sense amplifier circuits, each of the sense amplifier circuits being configured to determine data retained in the memory cell by supplying a read current to the bit line and detecting a magnitude of the read current flowing through the bit line after a setup time required for the read current to reach a steady state,
    the sense amplifier circuits being configured to carry out a plurality of read cycles on a plurality of the bit lines each connected to any one of the memory cells that are selected by a selected one of the word lines,
    during second and subsequent read cycles, the sense amplifier circuits being configured to stop supplying the read current to any one of the bit lines when it is determined in a preceding read cycle that a current not less than a certain determination current level flows therethrough, while keep supplying the read current to remaining bit lines, and
    the setup time of the bit lines in a first read cycle being set shorter than the setup time of the bit lines in the second and subsequent read cycles.

2. The non-volatile semiconductor storage device according to claim 1, wherein
    the setup time in the first read cycle is one half or less of the setup time in the second read cycle.

3. The non-volatile semiconductor storage device according to claim 2, wherein
    the setup time in the first read cycle is not more than 10 μS.

4. The non-volatile semiconductor storage device according to claim 1, wherein
    the determination current level in the first read cycle is greater than the determination current levels in the second and subsequent read cycles.

5. The non-volatile semiconductor storage device according to claim 4, wherein
    the setup time in the first read cycle is one half or less of the setup time in the second read cycle.

6. The non-volatile semiconductor storage device according to claim 5, wherein the setup time in the first read cycle is not more than 10 μS.

7. The non-volatile semiconductor storage device according to claim 1, wherein
    a first voltage applied to a selected one of the word lines in the first read cycle is lower than a second voltage applied to a selected one of the word lines in the second and subsequent read cycles.

8. The non-volatile semiconductor storage device according to claim 7, wherein
    the setup time in the first read cycle is one half or less of the setup time in the second read cycle.

9. The non-volatile semiconductor storage device according to claim 8, wherein
    the setup time in the first read cycle is not more than 10 μS.

10. The non-volatile semiconductor storage device according to claim 1, wherein
    a precharge level of the bit lines in the first read cycle is lower than a precharge level of the bit lines in the second and subsequent read cycles.

11. The non-volatile semiconductor storage device according to claim 10, wherein
    the setup time in the first read cycle is one half or less of the setup time in the second read cycle.

12. The non-volatile semiconductor storage device according to claim 11, wherein
    the setup time in the first read cycle is not more than 10 μS.

13. The non-volatile semiconductor storage device according to claim 1, wherein
    the sense amplifier circuits are configured to perform, in a verify read operation for determining whether data write is completed, a plurality of verify read cycles while one voltage is applied to a selected one of the word lines, and are configured to stop supplying the read current to the bit lines during a second or subsequent verify read cycle, if it is determined in the preceding verify read cycle that a current not less than a certain determination current level flows therethrough, and the read current being supplied only to the remaining bit lines, and
    wherein a setup time of the bit lines in a first verify read cycle is set shorter than a setup time of the bit lines in the second and subsequent verify read cycles.

14. The non-volatile semiconductor storage device according to claim 13, wherein
    when a write operation and the verify read operation are repeated until write of desired data is completed, the sense amplifier circuits are configured to perform a plurality of verify read cycles while one voltage is applied to the selected one of the word lines at least in a verify read operation performed immediately after a first write operation.

15. A method of reading data in a non-volatile semiconductor storage device, the non-volatile semiconductor storage device comprising:
a memory cell array including an array of NAND cell units, each of the NAND cell units including a memory string having a plurality of memory cells connected in series and selection transistors each connected to an end of the memory string;
a plurality of word lines each commonly connected to those of the memory cells aligned along a first direction;
a plurality of bit lines each connected to one end of each of the NAND cell units;
a source line connected to the other end of each of the NAND cell units; and
a plurality of sense amplifier circuits, each of the sense amplifier circuits configured to determine data retained in the memory cell by supplying a read current to the bit line and detecting a magnitude of the read current flowing through the bit line after a setup time required for the read current to reach a steady state, and
the method comprising:
performing a first read operation on a plurality of the bit lines connected to those of the memory cells that are selected by a selected one of the word lines; and
ceasing supply of the read current to any one of the bit lines when it is determined in the first read operation that a current not less than a certain determination current level flows therethrough, and keeping supply of the read current only to the remaining bit lines to perform a second read operation, and
a setup time of the bit lines in the first read operation being set shorter than a setup time of the bit lines in the second read operation.

16. The method of reading data according to claim 15, wherein
the setup time in the first read operation is one half or less of the setup time in the second read operation.

17. The method of reading data according to claim 16, wherein
the setup time in the first read operation is not more than 10 μS.

18. The method of reading data according to claim 15, wherein
the determination current level in the first read operation is greater than the determination current level in the second read operation.

19. The method of reading data according to claim 15, wherein
a first voltage applied to a selected one of the word lines in the first read operation is lower than a second voltage applied to the selected one of the word lines in the second read operation.

20. The method of reading data according to claim 15, wherein
a precharge level of the bit lines in the first read operation is lower than a precharge level of the bit lines in the second read operation.

* * * * *